US006758612B1

(12) United States Patent
Tabery et al.

(10) Patent No.: US 6,758,612 B1
(45) Date of Patent: Jul. 6, 2004

(54) SYSTEM AND METHOD FOR DEVELOPER ENDPOINT DETECTION BY REFLECTOMETRY OR SCATTEROMETRY

(75) Inventors: Cyrus E. Tabery, Cupertino, CA (US); Bharath Rangarajan, Santa Clara, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/050,471

(22) Filed: Jan. 16, 2002

(51) Int. Cl.[7] .................................................. G03D 5/00
(52) U.S. Cl. ........................ 396/569; 396/578; 396/604; 396/611; 118/52; 430/30; 430/311; 356/382; 427/420
(58) Field of Search .............................. 396/569, 578, 396/604, 611, 627; 118/52, 319–320; 430/30, 311; 427/240, 420

(56) References Cited

U.S. PATENT DOCUMENTS 5,308,447 A * 5/1994 Lewis et al. ................. 216/23
6,424,232 B1 * 7/2002 Mavretic et al. ........... 333/17.3
2002/0072001 A1 * 6/2002 Brown et al. ................ 430/30

* cited by examiner

Primary Examiner—D. Rutledge
(74) Attorney, Agent, or Firm—Amin & Turocy, LLP

(57) ABSTRACT

A system for regulating (e.g., terminating) a development process is provided. The system includes one or more light sources, each light source directing light to one or more patterns and/or gratings on a wafer. Light reflected from the patterns and/or gratings is collected by a measuring system, which processes the collected light. The collected light is indicative of the dimensions achieved at respective portions of the wafer. The measuring system provides development related data to a processor that determines the acceptability of the development of the respective portions of the wafer. The collected light may be analyzed by scatterometry and/or reflectometry systems to produce development related data and the development related data may be examined to determine whether a development process end point has been reached, at which time the system can control the development process and terminate development.

30 Claims, 17 Drawing Sheets

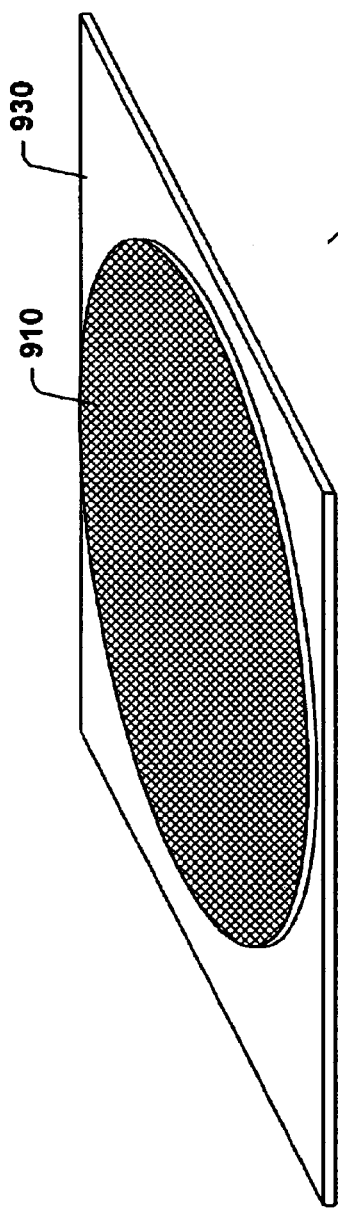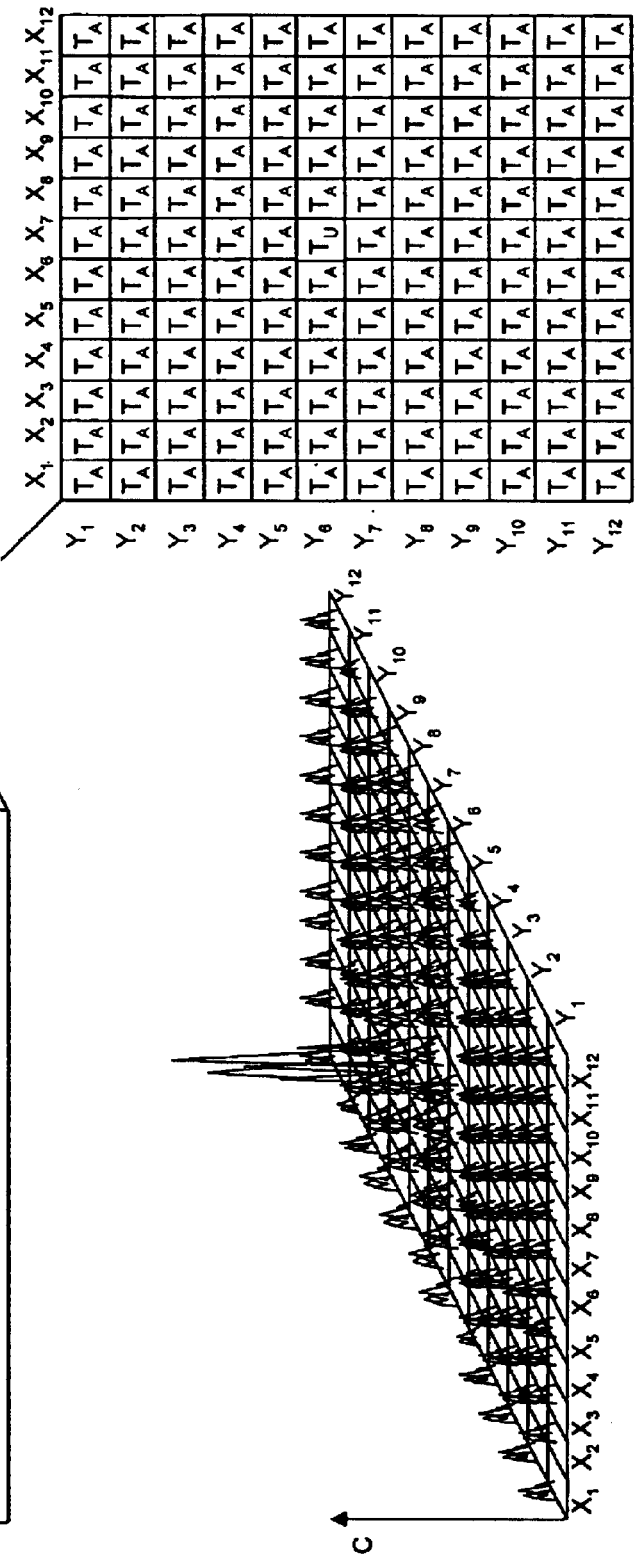
Fig. 9
Fig. 10
Fig. 11

SYSTEM AND METHOD FOR DEVELOPER ENDPOINT DETECTION BY REFLECTOMETRY OR SCATTEROMETRY

TECHNICAL FIELD

The present invention generally relates to controlling a semiconductor development process, and in particular to a system and method for developer endpoint detection by real-time feed forward control based on scatterometry and/or reflectometry analysis of in-situ grating measurements.

BACKGROUND

In the semiconductor industry, device densities continue to increase and thus, there have been, and continue to be, efforts toward scaling down device dimensions (e.g., at sub-micron levels) on semiconductor wafers. In order to scale down device dimensions (e.g., width and spacing of interconnecting lines, spacing and diameter of contact holes, surface geometry, such as corners and edges) of various features, more precise control of fabrication processes (e.g., development) are required. The dimensions of and between features can be referred to as critical dimensions (CDs). Reducing CDs, and reproducing more accurate CDs facilitates achieving higher device densities through scaled down device dimensions.

Conventional development monitoring systems have either lacked feedback control systems, requiring pre-calculated development steps, have had indirect feedback control, which is based on indirect information or have required sacrificing valuable wafer space for destructive testing. Such pre-determined calculations, indirect feedback and/or destructive testing based control do not provide adequate monitoring and thus do not facilitate precise control over the development process. Another conventional form of development control is performed by reproducing development times. But such time based control does not account for wafer to wafer variations and does not account for wafers with various feature densities. Monitoring tools employed in conjunction with metrology based feed-forward information are known in the art and provide improvements over time based control. But such metrology feed-forward systems can be improved by more accurate monitoring, better CD recognition and more precise feed-forward information.

The process of manufacturing semiconductors, or integrated circuits (commonly called ICs, or chips), typically includes more than a hundred steps, during which hundreds of copies of an integrated circuit may be formed on a single wafer. Each step can affect the CDs on the ICs. Generally, the manufacturing process involves creating several patterned layers on and into the substrate that ultimately forms the complete integrated circuit. This layering process creates electrically active regions in and on the semiconductor wafer surface. The size, shape and isolation of such electrically active regions, and thus the reliability and performance of integrated circuits employing such regions thus depend, at least in part, on the precision with which patterns can be developed on a wafer, and the resulting precision with which features beneath such developed patterns can be formed. Unfortunately, commonly used developing and resist processing fabrication systems check for CDs near or at the end of fabrication, or at pre-scheduled time intervals. These types of end-point and interval detection methods can be problematic for several reasons. For example, at late stages in the development process, the presence of at least one over-developed portion of a pattern may render the whole semiconductor device unusable, forcing it to be discarded. In addition, post-fabrication detection/quality control data do not provide a user with real-time information related to the device being fabricated, and thus opportunities to manipulate a development process before it results in a malformed wafer are lost. Post-fabrication data may only allow an estimation or a projection as to what adjustments are needed to correct the development process. Such estimations and/or projections concerning necessary adjustments may lead to continued or recurring fabrication errors. Moreover, such a lengthy adjustment process may cause subsequent fabricated wafers to be wasted in the hopes of mitigating development errors.

Visual inspection methods have been important in the development stages of integrated circuit manufacture. Visually inspecting developed photoresist patterns from a dose-focus matrix is well-known in the art. While visual inspection techniques may be simple to implement, they are difficult to automate, and do not provide in-situ opportunities for process manipulation. Further, visual techniques employing scanning electron microscopes (SEM) and atomic force microscopes (AFM) can be expensive, time-consuming and/or destructive.

Due to the extremely fine patterns that are exposed on a photo resist, controlling the developing process, whereby patterns are developed and hardened over oxide and/or other conductive or insulating layers, is a significant factor in achieving desired critical dimensions. A resist is a thin layer that is coated onto a substrate. The resist is hardened and selectively removed from selected areas after exposure by development. Achieving greater precision in development processes can result, for example, in more precise pattern reproduction which in turn facilitates achieving more precise CDs (e.g., desired lengths and widths between layers, between features and within features). Thus, an efficient system, and/or method, to monitor and control development processes is desired to facilitate manufacturing ICs exhibiting desired critical dimensions.

SUMMARY OF THE INVENTION

The following presents a simplified summary of the invention in order to provide a basic understanding of some aspects of the invention. This summary is not an extensive overview of the invention. It is not intended to identify key or critical elements of the invention or to delineate the scope of the invention. Its sole purpose is to present some concepts of the invention in a simplified form as a prelude to the more detailed description that is presented later.

The present invention provides a system and method for directly measuring critical dimensions (CDs) in-situ as they evolve during a development process and for feeding forward control information based on scatterometry and/or reflectometry analysis of such direct measurements so that the development process can be terminated when desired development has occurred. Scatterometry is concerned with the analysis of light reflected and/or refracted at various angles and reflectometry measures the intensity and polarization properties of specularly reflected light. Properties of the reflected, scattered and/or refracted light can be directly correlated to parameters including, the thickness of grating lines and the like. Thus, the present invention, through such real-time scatterometry and/or reflectometry analysis facilitates more accurate CD control from wafer to wafer than is possible through conventional methods and facilitates manipulating (e.g., terminating) a development process.

In accordance with one aspect of the present invention, a test grating similar to the product pattern is formed on the wafer, and thus, during the development process, the test grating can be probed by a scatterometry beam and/or reflectometry beam. The light reflected and/or refracted from the test grating can be employed to extract CD and evolving profile information. In the development process, a puddle of developing material forms on the surface of a wafer. To facilitate probing the test grating, the wafer, which may be located in a spin track, may be spun down so that the puddle of developing material will be static during the beam probe. Once the development process has proceeded to a point where the grating is opened, then CDs from the test grating and reconstructed profile measurements can be analyzed to determine whether an acceptable development process has occurred. If target CDs are not achieved, then the wafer may be marked for reworking and/or discarded.

In accordance with another aspect of the present invention, a system for monitoring and regulating a development process is provided. The system includes a development component that can adapt development parameters (e.g., time, temperature, formula, concentration) associated with developing a photoresist on a wafer and a development component driving system for driving the development component. The system further includes a system for directing light toward a grating located on the wafer, a development monitoring system operable to measure development progress (e.g., under-developed, over-developed, acceptably developed) from light reflected from the grating and a processor coupled to the development monitoring system and the development component driving system. The processor receives development progress data from the measuring system and analyzes the development progress data by comparing the development progress data to stored development data to generate feed-forward control data that can be employed to control the development component, including terminating the development process. In one example of the present invention, the development monitoring system further includes a scatterometry system and/or a reflectometry system for processing the light reflected from the gratings.

Another aspect of the present invention provides a method for monitoring and regulating a development process. The method includes logically partitioning a wafer into portions, fabricating gratings on the wafer, directing an incident light onto the gratings, collecting a reflected light reflected from the gratings, measuring the reflected light to determine CDs associated with the grating, computing adjustments, including terminating instructions, for development components by comparing the CDs to scatterometry and/or reflectometry signatures associated with stored CDs and adjusting the development process based, at least in part, on the computed adjustments.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

BRIEF DESCRIPTION OF THE DRAWINGS

FIG. 9 is a perspective illustration of a substrate (including photo resist) that may be developed in accordance with an aspect of the present invention.

FIG. 10 is a representative three-dimensional grid map of a wafer illustrating CD measurements taken in accordance with an aspect of the present invention.

FIG. 11 is a development measurement table correlating the CD measurements of FIG. 10 with desired values for the CDs in accordance with the present invention.

DETAILED DESCRIPTION OF THE INVENTION

Figure 1:
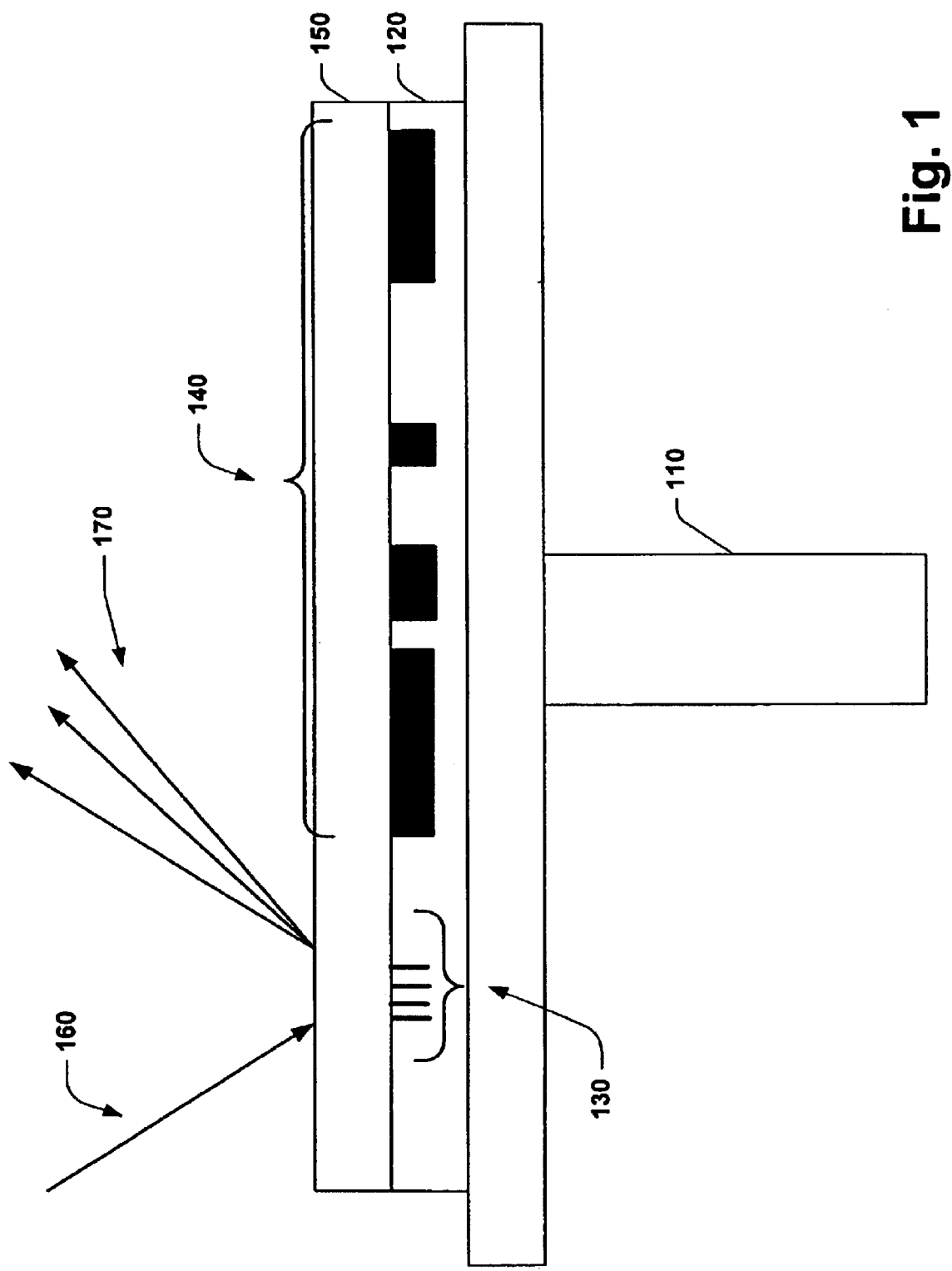
FIG. 1 is a block diagram illustrating a scatterometry and/or reflectometry beam being employed to probe a test grating through a developer puddle on a wafer during a development process in a spin track, in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, to one skilled in the art that the present invention may be practiced without these specific details. In other instances, well-known structures and devices are shown in block diagram form in order to facilitate describing the present invention.

The term "component" refers to a computer-related entity, either hardware, a combination of hardware and software, software, or software in execution. For example, a component may be a process running on a processor, a processor, an object, an executable, a thread of execution, a program and a computer. By way of illustration, both an application running on a server and the server can be components. By way of further illustration, both a spin track and a process controlling a spin track can be components.

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks) may be employed.

Referring initially to FIG. 1, a scatterometry/reflectometry beam 160 is being employed to probe a test grating 130 through a developer puddle 150 on a wafer 120 during a development process while the wafer 120 is supported on a component 110 of a spin track. The beam 160 is directed at the test grating 130 and is reflected, refracted and/or scattered into the resulting beam(s) 170. Such beam(s) 170 may vary in parameters including, but not limited to, phase, intensity and polarization, and thus are suitable for processing by scatterometry and/or reflectometry systems and techniques. While the test grating 130 is illustrated as four uniform lines, it is to be appreciated that test gratings of various sizes, shapes and content may be employed in accordance with the present invention. Thus, test gratings that simulate a portion of the pattern being developed on the wafer 120 can be employed to provide more precise monitoring of the developing pattern. Thus, a portion of a pattern 140 being developed on the wafer 120 may be simulated in the test grating 130, which facilitates accounting for wafer to wafer variations, providing advantages over conventional systems.

As the development of the pattern 150 on the wafer 120 progresses, a puddle 150 of developer may form on the wafer 120. In one example of the present invention, scatterometry and/or reflectometry analysis of the beam(s) 170 may benefit from the puddle 150 being static, and thus the component 110 of the spin track may be spun down to facilitate the puddle 150 becoming static. In one example of the present invention, as the development process nears completion, the puddle 150 may be removed from the wafer 120 to facilitate more precise probing of the test grating 130 and/or the pattern 140. While a spin track is described in connection with FIG. 1, it is to be appreciated that development processes in other devices (e.g., sinks, enclosed spray units, etc.) may be monitored controlled by the present invention. Furthermore, while one beam 160 and one grating 130 are illustrated in connection with FIG. 1, it is to be appreciated that one or more beams 160 and/or one or more gratings 130 may be employed in accordance with the present invention.

Figure 2:
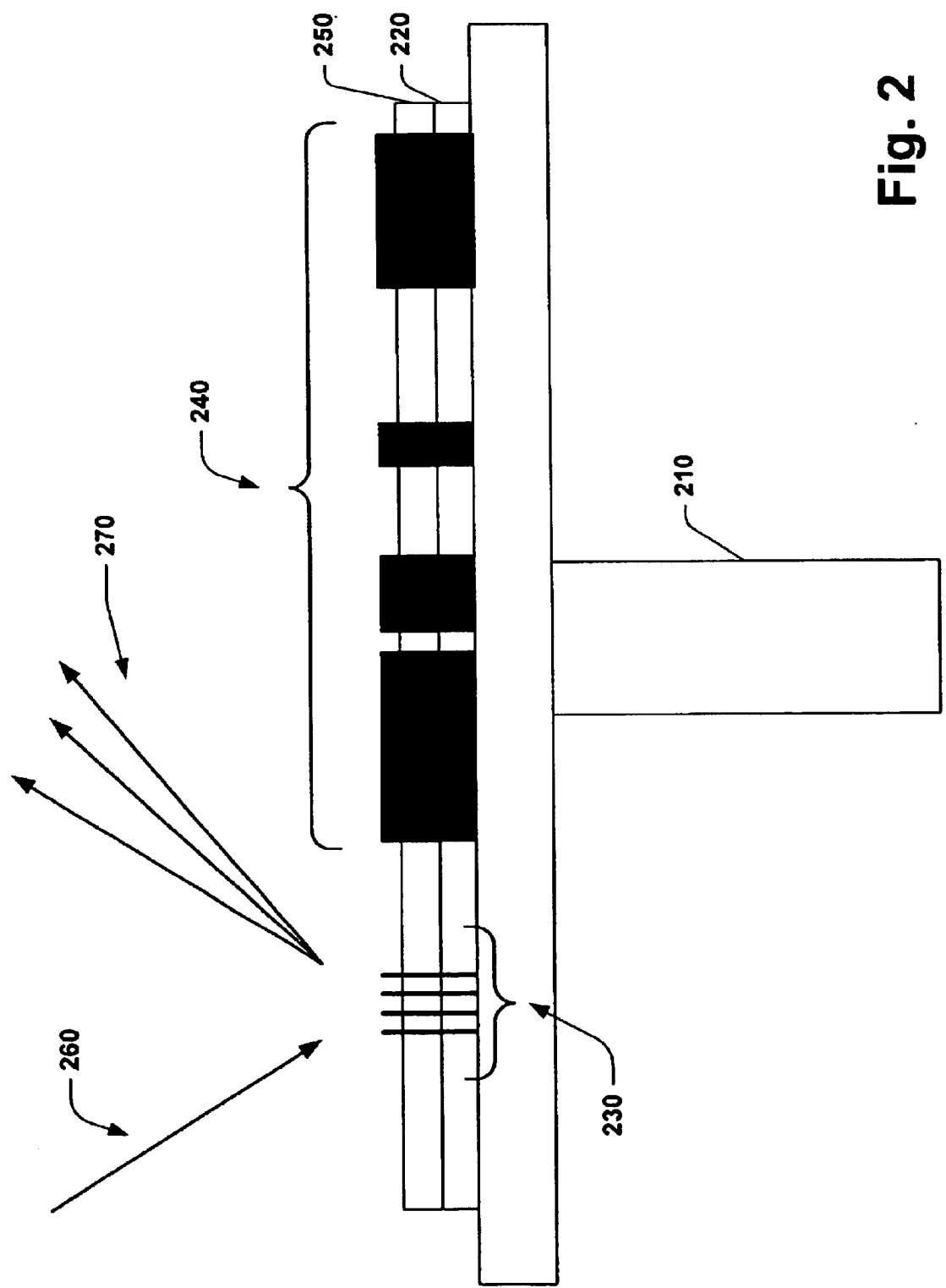
FIG. 2 is a block diagram illustrating a scatterometry and/or reflectometry beam being employed to probe a test grating at a later point in development on a wafer during a development process in a spin track, in accordance with an aspect of the present invention.

Referring now to FIG. 2, a scatterometry/reflectometry beam 260 is being employed to probe a test grating 230, where the test grating 230 has been further developed. The grating 230 is located on a wafer 220, which is supported on a component 210 of a spin track. The beam 260 is directed at the test grating 230 and is reflected, refracted and/or scattered into the resulting beam(s) 270. Such beam(s) 270 may vary in parameters including, but not limited to, phase, intensity and polarization, and thus are suitable for processing by scatterometry and/or reflectometry systems and techniques. Thus, phase, intensity and/or polarization of the beam(s) 270 may vary from the phase, intensity and/or polarization of the beam(s) 170 (FIG. 1), which facilitates identifying different points in the development process, and thus facilitates identifying when the development process should be terminated.

As the development of the pattern 250 on the wafer 220 progresses, a puddle 250 of developer may form on the wafer 220. In one example of the present invention, scatterometry and/or reflectometry analysis of the beam(s) 270 may benefit from the puddle 250 being static, and thus the component 210 of the spin track may be spun down to facilitate the puddle 250 becoming static. While a spin track is described in connection with FIG. 2, it is to be appreciated that development processes in other devices (e.g., sinks, enclosed spray units, etc.) may be monitored controlled by the present invention. Furthermore, while one beam 260 and one grating 230 are illustrated in connection with FIG. 2, it is to be appreciated that one or more beams 260 and/or one or more gratings 230 may be employed in accordance with the present invention. Further still, while the puddle 250 is illustrated substantially covering the evolving grating 230 and/or pattern 240, it is to be appreciated that development processes where photoresist is removed from the wafer 220 may also be monitored and/or controlled by the present invention.

Figure 3:
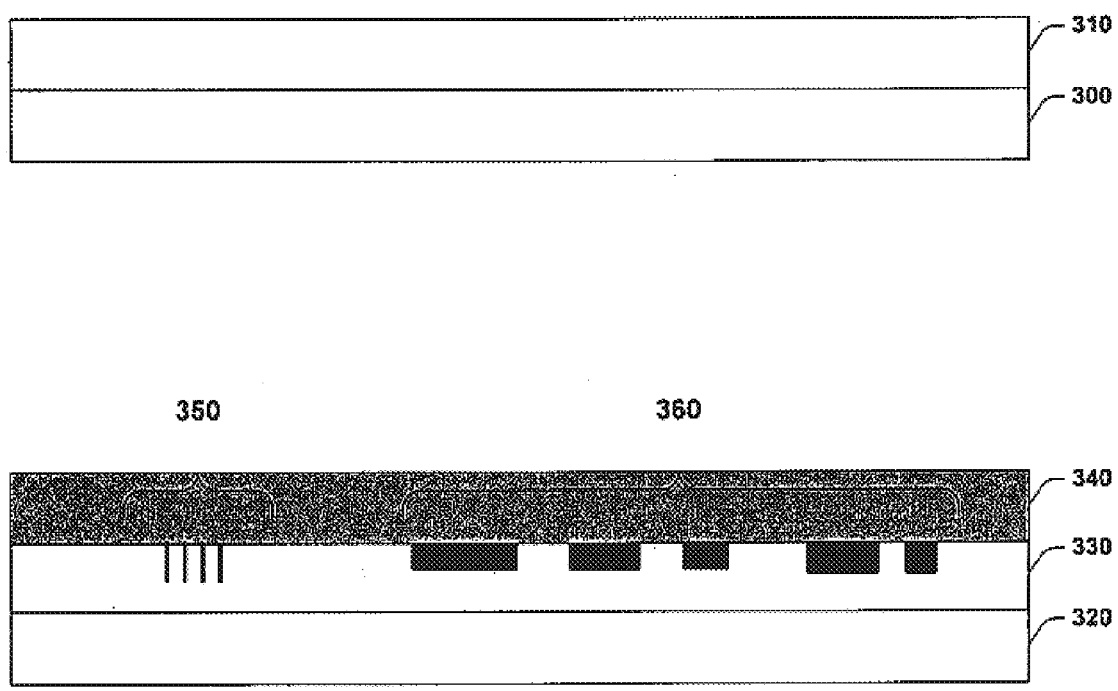
FIG. 3 is a cross section view of wafers before and during development where the wafers include a photoresist with a latent image and a photoresist with a developing image, in accordance with an aspect of the present invention.

FIG. 3 illustrates a cross section of a wafer 300 before development. Thus, the wafer 300 includes a photoresist layer 310 wherein there is a latent image. The latent image may include one or more gratings and a pattern. Such patterns may vary in feature density, and thus may benefit from development processes adapted to the feature density. After a developing process begins (e.g., developing solution applied to photoresist), the latent image will begin to emerge, at which time scatterometry and/or reflectometry may be employed to analyze the emerging image. The rate at which the latent image will emerge may depend on parameters including, but not limited to, time, temperature, pressure, concentration, formula and feature density. Thus, a beam that probes the emerging latent image (e.g., gratings and/or pattern features) may be directed at the emerging latent image, with a reflected and/or refracted beam subjected to such scatterometry and/or reflectometry processing.

Wafer 320 illustrates a photoresist layer 330 wherein an image 360 is emerging. The image 360 has begun to emerge in response to a developing process that includes exposing the photoresist 330 to a developing solution 340. The photoresist layer 330 also includes a test grating 350 that has begun to emerge in response to the developing process. Since patterns (e.g. pattern 360) may vary widely from layer to layer and wafer to wafer, the test grating 350 may be fashioned to facilitate determining the end point of the development of the widely varying patterns. By way of illustration and not limitation, a very dense pattern may require a lengthier and/or more involved development process, and thus a denser grating may be analyzed by scatterometry and/or reflectometry means to determine when such a dense pattern has been adequately developed. By way of further illustration, a very sparse pattern may require a shorter and/or less involved development process, and thus a more sparse grating may be analyzed by scatterometry and/or reflectometry means to determine when such a sparse pattern has been developed. Thus, the present invention provides a system that facilitates detecting development process end points that account for wafer to wafer and/or pattern to pattern variations, providing advantages over conventional systems.

Figure 4:
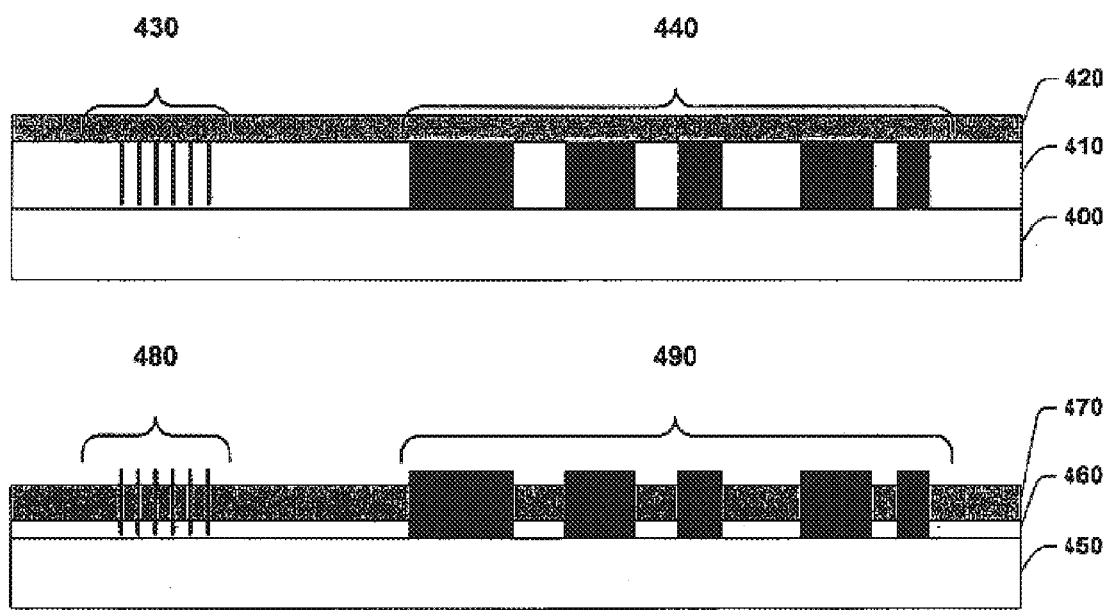
FIG. 4 is a cross section view of a wafer during development as the development process nears the development endpoint, in accordance with an aspect of the present invention.

FIG. 4 illustrates a cross section view of a wafer 400 during development as the development process nears the development endpoint. Thus, a pattern 440 and a test grating 430 being developed by a developing solution 420 have extended substantially entirely through a photoresist layer 410. Again, a beam directed at the evolving grating 430 may be scattered, reflected and/or refracted differently from a beam directed at the evolving grating 350 and thus parameters including, but not limited to phase, intensity and/or polarization of the reflected light may be analyzed to determine whether the grating 430 (and thus the pattern 440) have evolved to a point where development should be terminated.

FIG. 4 also illustrates a cross section view of a wafer 450 wherein the photoresist layer 410 is decreasing as the development process progresses. Thus, the surface of the developer puddle 470 may fall below the top of the hardened photoresist that forms a test grating 480 and/or pattern 490. When the surface of the developer puddle 470 falls below the top of the hardened photoresist that forms the test grating 480 and/or pattern 490, a beam directed at the grating 480 and/or pattern 490 may be reflected and/or refracted differently from a beam directed at the grating 430 and/or pattern 440, which remain substantially below the level of the surface of the developer puddle 420. In one example of the present invention, scatterometry and/or reflectometry analysis may be adapted based on the degree to which the developer puddle covers emerging test gratings.

Figure 5:
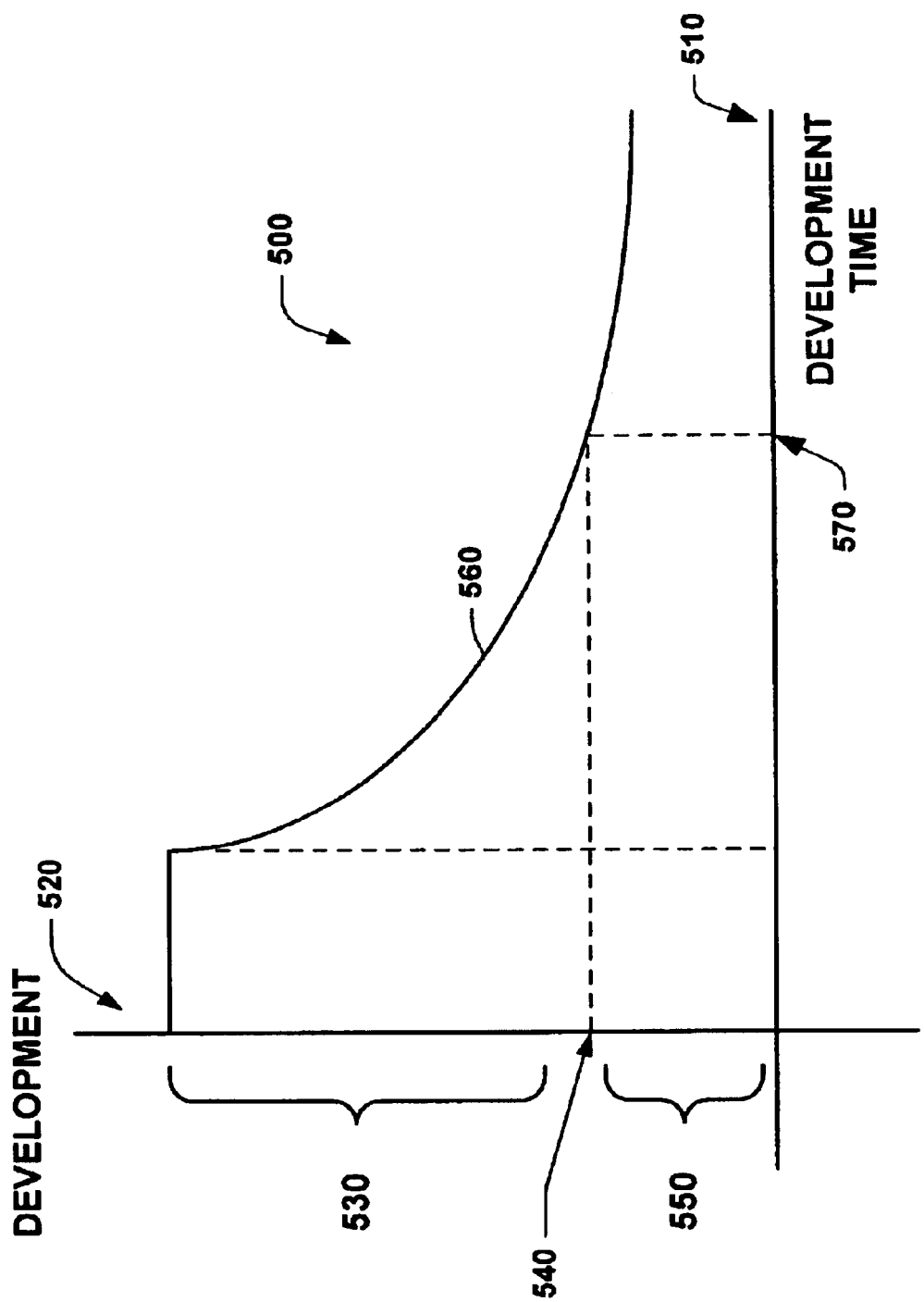
FIG. 5 is a graph relating developer time to development progress as employed in endpoint analysis in accordance with an aspect of the present invention.

Turning now to FIG. 5, a graph 500 relates development time on an X axis 510 to development progress on a Y axis 520 to facilitate development endpoint analysis. The curve 560 represents the degree to which development has progressed. Thus, throughout range 530, the photoresist whose development is being illustrated by curve 560 is underdeveloped. Similarly, throughout the range 550, the photoresist whose development is being illustrated by curve 560 is over-developed. Thus, a goal of precise end point detection would be to determine a point 540 where the photoresist is neither under-developed nor over-developed but rather is developed to a desired degree, so that at time 570 the development process can be terminated.

Figure 6:
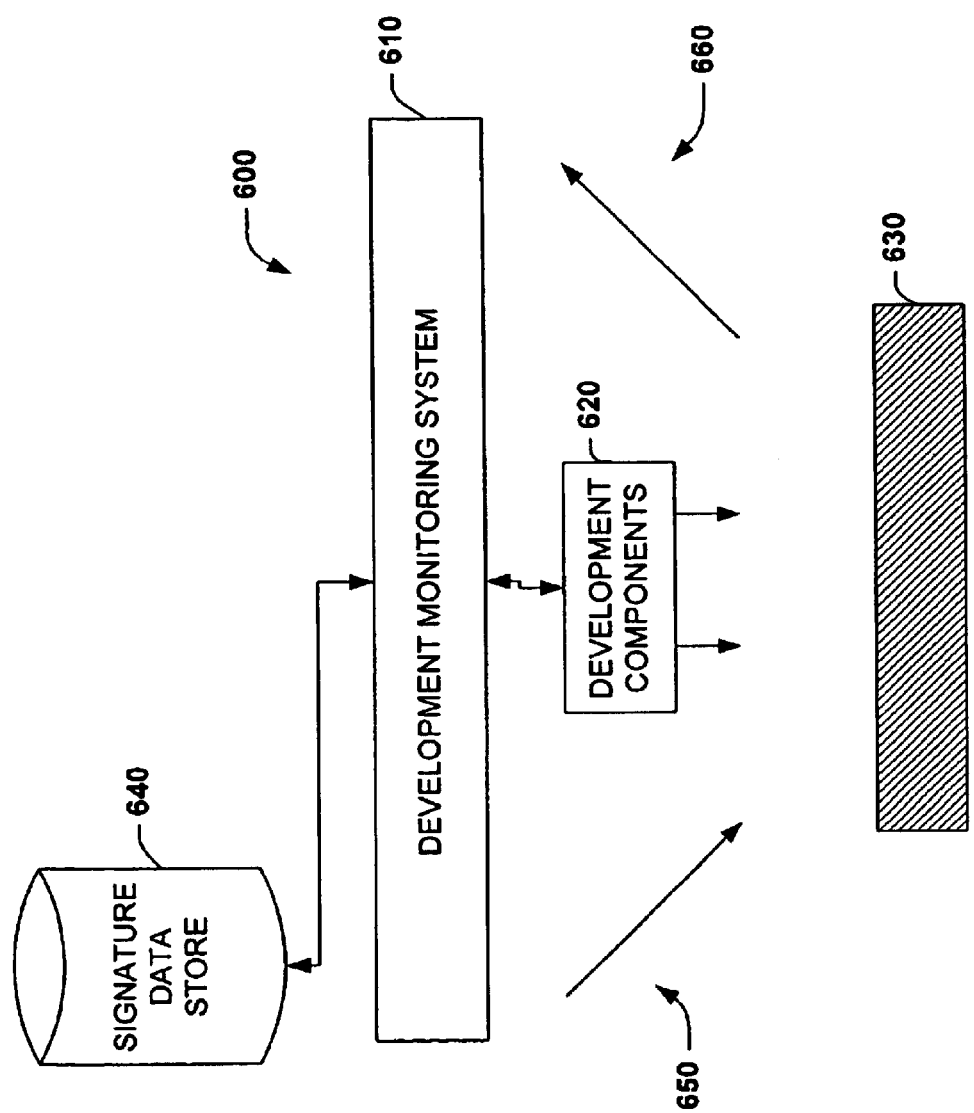
FIG. 6 is a schematic block diagram of a system for monitoring and controlling a development process in accordance with an aspect of the present invention.

Referring now to FIG. 6, a system 600 for monitoring and controlling a development process is illustrated. Such development processes may be employed, for example, to develop and harden a pattern in a photoresist. The development rate may vary in response to factors including, but not limited to, different developer formulae, concentrations, reaction chamber temperatures, reaction chamber pressures, reaction chamber atmospheres, wafer to wafer variations and feature density on a wafer. Conventional techniques may employ indirect measurements to determine development progress. But such techniques do not provide direct information concerning CDs being achieved in a photoresist on wafer 630. Thus, due to the number and character of factors affecting the development process, such conventional techniques may not provide adequate monitoring and/or control opportunities for development processes.

The system 600 includes a development monitoring system 610 that can be employed to direct a light 650 at a wafer 630 upon which a pattern and/or grating is being developed. The development monitoring system 610 can be a standalone device and/or can also be distributed between two or more cooperating devices and/or processes. Similarly, the development monitoring system 610 can reside in one physical or logical device (e.g., computer, process) and/or be distributed between two or more physical or logical devices. The development monitoring system 610 may include one or more components that are located inside a process chamber (e.g., a spin track) and/or one or more components that are not located inside a process chamber.

The light 650 may be generated by many different light sources, and in one example aspect of the present invention the light 650 is generated by a frequency-stabilized laser. The development monitoring system may direct the light 650 at substantially all of the wafer 630 and/or at selected portions of the wafer (e.g., a test grating). By way of illustration, in one example aspect of the present invention, the light 650 may be directed at selected portions of the wafer 630, where such portions provide data sufficient to generate scatterometry and/or reflectometry signatures. A light 660 reflected from the wafer 630 is collected by the development monitoring system 610, which may then employ scatterometry and/or reflectometry techniques to analyze the reflected light 660 to determine one or more parameters associated with developing the pattern in the photoresist on the wafer 630. For example, the depth and/or width of lines in a test grating may be analyzed to determine whether acceptable critical dimensions have been achieved and thus whether development should be terminated and/or adapted. Other parameters including, but not limited to horizontal development rate, vertical development rate and development-rate percent uniformity may also be monitored.

It is to be appreciated that the surface of the wafer 630, which may include features in a pattern being developed, can both reflect and refract the light 650, so that the light 660 can be a complex reflected and/or refracted light. The scatterometry and/or reflectometry analysis can include comparing one or more scatterometry and/or reflectometry signatures associated with the reflected light 660 to one or more scatterometry and/or reflectometry signatures stored in a signature data store 640. Such signatures may be generated, for example, by combining phase, polarization and/or intensity information associated with the reflected light 660.

As development progresses, light reflecting from a wafer 630 may produce various signatures. The sequence in which such signatures are generated can be employed to determine the rate at which development is progressing and also to predict times when a spin track may be spun down for a subsequent measurement. For example, at a first point in time T1, light reflected from the wafer 630 may produce a signature S1 that indicates that lines with a first width W1 and depth D1 have been produced and that a test grating should be probed at a second point in time T2 and a third point in time T3. Thus, at the second point in time T2, light reflected from the wafer 630 may produce a signature S2 that indicates that lines with a second width W2 and depth D2 have been produced and at a third point in time T3, light reflected from the wafer 630 may produce a signature S3 that indicates that lines with a third width W3 and depth D3 have been produced. Analyzing the sequence of signatures, and the time required to produce transitions between such signatures can facilitate determining whether development is progressing at an acceptable rate, can facilitate predicting optimal times to spin down a spin track development process to probe the development process and can facilitate determining when development should be terminated. Feedback information can be generated from such sequence analysis to maintain, increase and/or decrease the rate which development progresses. For example, one or more developer formulae and/or concentrations can be altered to affect the developing rate based on the signature sequence analysis.

The signature data store 640 can store data in data structures including, but not limited to one or more lists, arrays, tables, databases, stacks, heaps, linked lists and data cubes. The signature data store 640 can reside on one physical device and/or may be distributed between two or more physical devices (e.g., disk drives, tape drives, memory units). Analyses associated with the reflected light 660 and/or the signatures stored in the signature data store 640 can be employed to control one or more developing parameters (e.g., formula, concentration, time, temperature, pressure) and in the present invention can be employed to terminate development.

The precision with which resist portions are developed to create fine line patterns and the resulting precision in the distance between the remaining portions of a substrate protected by a hardened photoresist corresponds to the precision with which CDs are achieved. Therefore, the precision of the processing performed by the developing system 600 is directly related to the feature sizes and CDs that can be achieved on the wafer 630.

Figure 7:
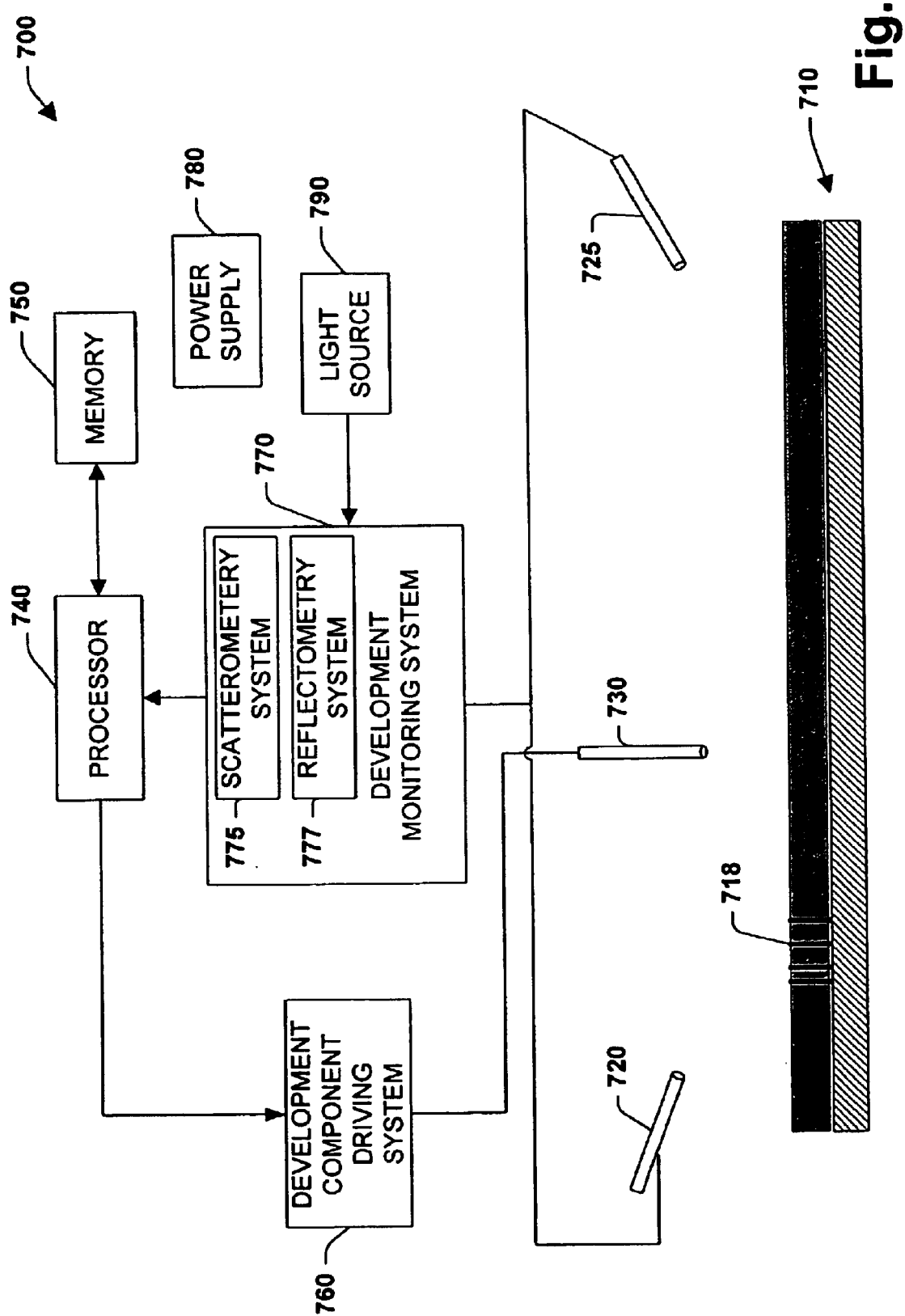
FIG. 7 is schematic block diagram of a development process CD monitoring and controlling system in accordance with an aspect of the present invention.

FIG. 7 illustrates a system 700 for monitoring and controlling development processes. The system 700 operates to control one or more development components 730 in order to terminate a development process at a precise point in time and/or to optimize development processes. A development monitoring system 770, a processor 740 and a development component driving system 760 work cooperatively to control one or more development components 730.

The development components 730 are coupled to and controlled directly by the development component driving system 760. The development component driving system 760 receives information and/or instructional commands from the processor 740. The processor 740 determines the content and type of information transmitted to the development component driving system 760 according to its analysis of data received from and collected by the monitoring system 770. Thus, through the interaction of components 730, 770, 740 and 760, the system 700 has the ability to terminate an underway development process and also, in one example of the present invention, to improve subsequent development processes for similar wafers and/or layers. In addition, by communicating measurements relating to recently developed patterns/wafers to the processor 740, the processor 740 can control the development component driving system 760, which can thus regulate the one or more development components 730 to facilitate obtaining more precise and improved development processes. Thus development end points can be precisely monitored, development errors (e.g., over-developing, under-developing) can be mitigated and higher packing densities and smaller feature sizes can be achieved.

The system 700 includes one or more target light sources 720 to project light onto respective portions of the wafer 710 and/or a photoresist 715 on the wafer 710. A portion of the wafer 710 may have one or more gratings 718 and/or features located on that portion. Light reflected and/or refracted by the one or more gratings 718 is collected by one or more light detecting components 725, and processed by a development monitoring system 770 to measure at least one parameter relating lo the development of one or more patterns and/or the one or more gratings 718. For example, spaces between portions of the grating 718 can be measured and compared to desired critical dimensions (CDs). The reflected light is measured with respect to the incident light in order to obtain the various parameters relating to the gratings 718.

The monitoring system 770 may include a scatterometry system 775. It is to be appreciated that any suitable scatterometry system may be employed to carry out the present invention, and such systems are intended to fall within the scope of the claims appended hereto. Similarly, the monitoring system 770 may include a reflectometry system 777. It is to be appreciated that any suitable reflectometry system may be employed to carry out the present invention, and such systems are intended to fall within the scope of the claims appended hereto.

A light source 790 (e.g., a laser) provides light to the one or more target light sources 720 via the monitoring system 770. Preferably, the light source 790 is a frequency-stabilized laser, however, it will be appreciated that any laser or other light source (e.g., laser diode or helium neon (HeNe) gas laser) suitable for carrying out the present invention may be employed. One or more light detecting components 725 (e.g., photo detector, photo diodes) collect light reflecting from, or refracted by the one or more gratings 718 and/or the one or more developing patterns. The monitoring system 770 may also process the measured light data into a data form compatible with or understandable to the processor 740.

The processor 740 is operatively coupled to the monitoring system 770 and receives the measured development parameter data from the monitoring system 770. The processor 740 determines the acceptability and/or progress of the development of respective portions of the wafer 710 by examining measured CDs and comparing such measured CD values to stored acceptable and unacceptable CD values. The CD values may be associated with one or more signatures stored, for example, in a memory 750. In determining the acceptability and/or progress of an on-going and/or recently completed development process, the processor 740 may also determine to what extent, if any, adjustments to the development components 730 may be attempted to optimize subsequent development processes. Upon making the determination, the processor 740 transmits this information to the development component driving system 760, which then makes one or more adjustments to the development components 730. It is to be appreciated that one fundamental adjustment made by the development component driving system 760 is to terminate a development process.

As described above, the processor 740 is also coupled to the development component driving system 760 that directs and controls the one or more development components 730 (e.g., temperature controllers, pressure controllers, formulae controllers, concentration controllers, etc.). In one example of the present invention, the development component driving system 760 is controlled, at least in part, by the processor 740 to selectively vary the operation of the respective development components 730. Respective portions of the wafer 710 are associated with one or more corresponding development components 730. The processor 740 monitors the development of one or more patterns and/or one or more gratings 718, and selectively regulates the corresponding development components 730. The transmission and relay of information between the monitoring system 770, the processor 740, the development component driving system 760 and the development components 730 creates effective feed back control that facilitates improving IC quality by producing more precisely developed patterns by more precisely identifying development process endpoints.

The processor 740, or central processing unit, may be any of a plurality of processors, such as the AMD K7, the AMD Athlon and other similar and compatible processors. The processor 740 is programmed to control and operate the various components within the system 700 in order to carry out the various functions described herein. The manner in which the processor 740 is programmed to carry out the functions relating to the present invention will be apparent based on the description provided herein.

A memory 750, which is operatively coupled to the processor 740, is also included in the system 700 and serves to store, among other things, program code executed by the processor 740 for carrying out operating functions of the system 700 as described herein. For example, the memory 750 can hold patterns to which observed data can be compared. The memory 750 also serves as a storage medium for temporarily storing development parameter data such as development progress values, development progress tables, component coordinate tables, grating sizes, grating shapes, scatterometry information, reflectometry information, achieved CDs, desired CDs and other data that may be employed in carrying out the present invention.

A power supply 780 provides operating power to the system 700. Any suitable power supply (e.g., battery, line power) may be employed to carry out the present invention.

Figure 8:
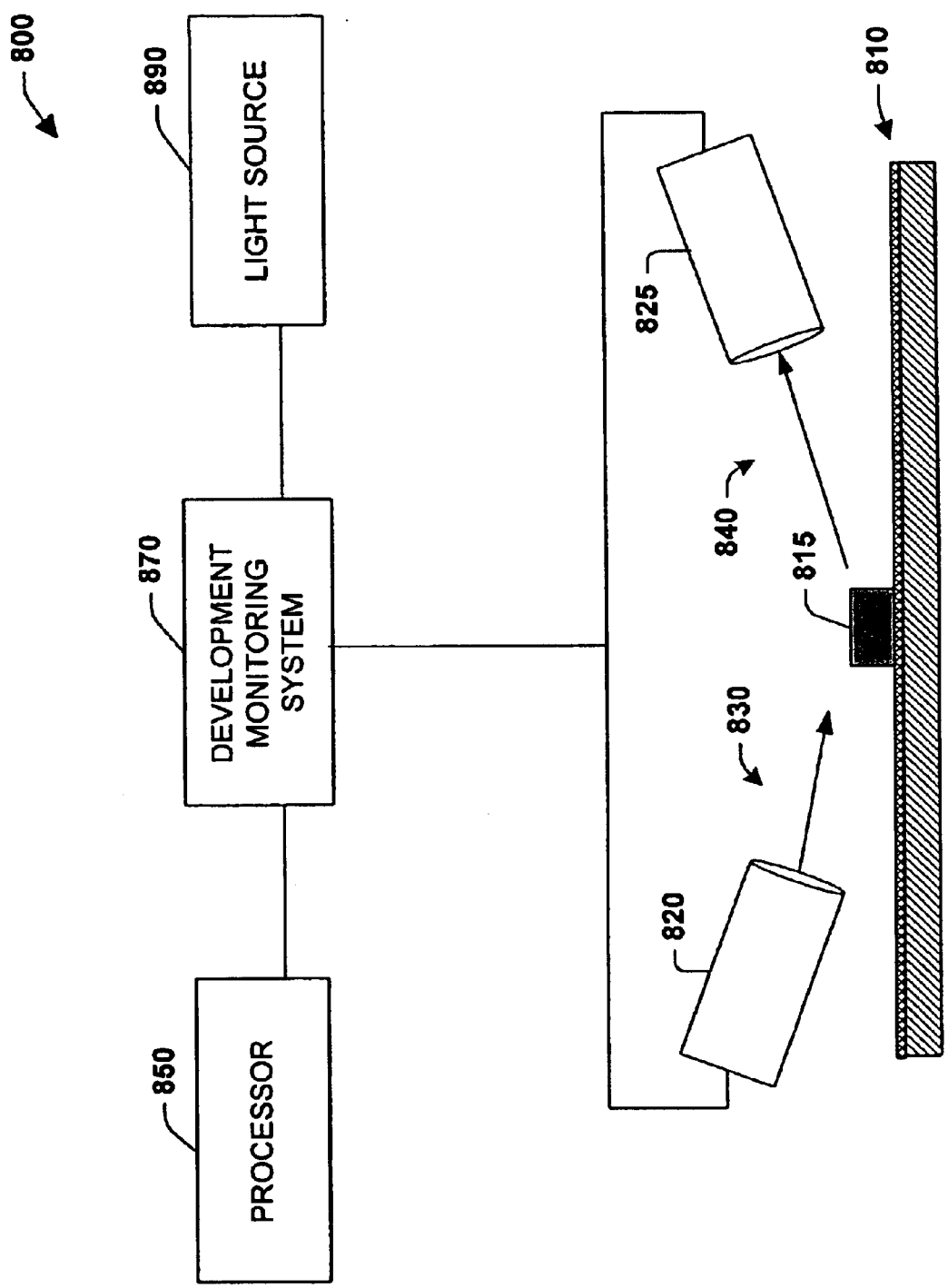
FIG. 8 is a partial schematic block diagram of the system of FIG. 7 being employed in connection with determining development process end point by measuring grating CDs in accordance with an aspect of present invention.

FIG. 8 illustrates the system 800 being employed to measure the development of a particular portion of the wafer 810. The target light source 820 directs a light 830 incident to the surface of the wafer 810. The light 830 may be referred to as the reference beam, and thus the phase, intensity and/or polarization of the reference beam 830 may be recorded in the development monitoring system 870 to facilitate later comparisons to a reflected beam 840. The angle of the reflected light 840 from the surface of the wafer 810 will vary in accordance with the evolving dimensions of a grating 815, and/or with the evolving dimensions of one or more patterns being developed in the wafer 810. Similarly, the intensity and polarization properties of the specularly reflected light 840 may vary in accordance with the evolving dimensions. The one or more light detecting components 825 collect the reflected light 840 and transmit the collected light, and/or data associated with the collected light, to the monitoring system 870. The monitoring system 870 collects the reflected light 840, and/or related data, in accordance with scatterometry and/or reflectometry techniques. The monitoring system 870 then provides a processor with data corresponding to the development characteristics associated with the wafer 810. The data may include, for example, information relating to the dimensions of over-developed areas relative to, or independent of, dimensions of under-developed areas, and/or surface characteristics as well as other measurements relating to the development process.

In another aspect of the invention, the data may also include conclusory information including, but not limited to, whether desired dimensions have been reached and whether development should continue, whether desired CDs are being achieved in a timely fashion and thus whether adjustments are required and whether measured development dimensions are within a pre-determined range.

The monitoring system 870 provides direct, real-time measurements as opposed to measurements taken according to pre-determined system schedules and measurements taken post-fabrication. Providing direct, real-time feedback facilitates selective control of development processes and improved development precision over conventional methods and/or apparatus and thus development end points may be more precisely detected, providing advantages over conventional systems.

Turning now to FIGS. 9–11, another aspect of the present invention is shown. In addition to the methods described above, a wafer 910 may be logically partitioned into grid blocks to facilitate determining positions or locations where the wafer 910 is developed to a point where an endpoint has been detected and/or positions or locations that may benefit from adjusting one or more development parameters. Obtaining such positions or locations may facilitate determining to what extent, if any, development process parameter adjustments are necessary and/or may facilitate determining a developer end point. Obtaining such information may also assist in determining problem areas associated with development processes.

FIG. 9 illustrates a perspective view of a chuck 930 supporting the wafer 910, whereupon one or more gratings may be formed. The wafer 910 may be divided into a grid pattern as shown in FIG. 10. Each grid block (XY) of the grid pattern corresponds to a particular portion of the wafer 910, and each grid block is associated with one or more gratings and/or one or more portions of one or more gratings. The grid blocks are individually monitored for development progress and endpoint detection. It is to be appreciated that the size and/or shape of gratings can be manipulated to facilitate analyzing different critical dimensions. For example, for a particular layer in an integrated circuit, a CD relating to a width between features may be important. Thus, the gratings can be patterned to optimize analyzing the width between features.

In FIG. 10, one or more gratings in the respective portions of the wafer 910 ($X_1Y_1 \ldots X_{12}, Y_{12}$) are monitored for CDs produced during the development process using reflected light, the monitoring system 770 (FIG. 7) and the processor 740 (FIG. 7). Exemplary CD measurements produced during development for each grating are shown. As can be seen, the CD measurement at coordinate $X_7Y_6$ is substantially higher than the CD measurement of the other portions XY. It is to be appreciated that the wafer 910 may be mapped into any suitable number of grid blocks (e.g., one grid block, one hundred grid blocks, one hundred and forty four grid blocks), and any suitable number of gratings (e.g., one grating, ten gratings) may formed on the wafer 910. Although the present invention is described with respect to one development component 730 (FIG. 7) corresponding to one grid block XY, it is to be appreciated that any suitable number of development components 730 (FIG. 7) corresponding to any suitable number of wafer portions/grid blocks may be employed.

FIG. 11 is a representative table of CD measurements taken for the various grid blocks that have been correlated with acceptable CD values for the portions of the wafer 910 mapped by the respective grid blocks. As can be seen, all the grid blocks, except grid block $X_7Y_6$, have CD measurements corresponding to an acceptable CD table value ($T_A$) (e.g., are within an expected range of development measurements), while grid block $X_7Y_6$ has an undesired CD table value ($T_U$). Thus, it has been determined that an undesirable development condition exists at the portion of the wafer 910 mapped by grid block $X_7Y_6$. Accordingly, developing parameters may be adjusted to attempt to control the developing and produce a desired CD value for grid block $X_7Y_6$.

Alternatively, a sufficient number of grid blocks may have achieved a desired development so that the single underdeveloped grid block does not warrant further development, since the already properly developed grid blocks may thus become over-developed. Therefore, development may be terminated for the wafer, and the single under-developed grid block may be marked for discard. It is to be appreciated that the development parameters may be adapted so as to maintain, increase, and/or decrease, the rate of development of the respective portions of the wafer 910 as desired. When the development process has reached a pre-determined threshold level (e.g., X % of grid blocks have acceptable development CDs), development may be terminated, thus enabling more precise control of the development process, which provides advantages over conventional systems.

Figure 12:
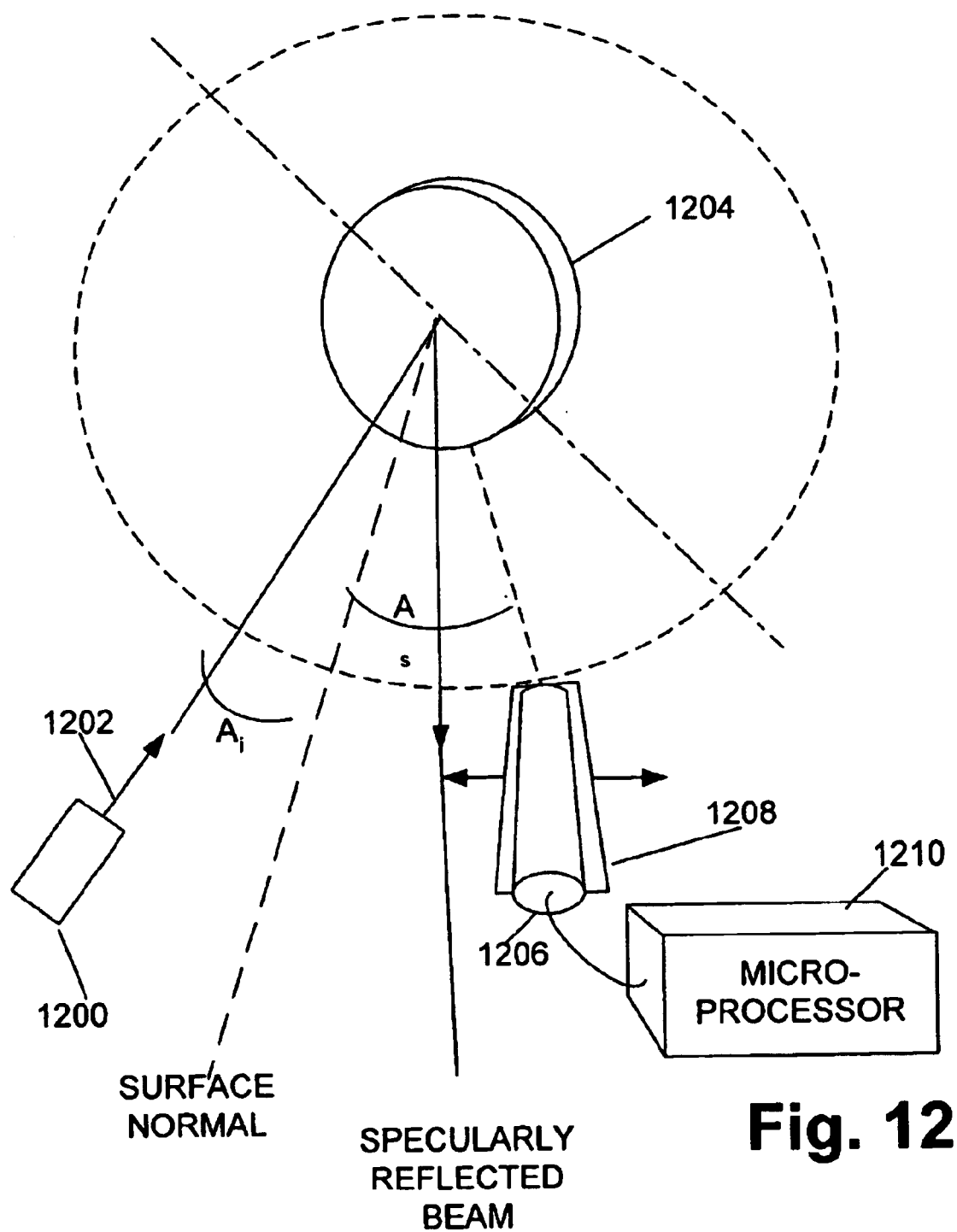
FIG. 12 illustrates an exemplary scatterometry/reflectometry system collecting reflected light.

FIG. 12 illustrates an exemplary scatterometry/reflectometry system collecting reflected light. Light from a laser 1200 is brought to focus in any suitable well-known manner to form a beam 1202. A sample, such as a wafer 1204, is placed in the path of the beam 1202 and a photo detector or photo multiplier 1206 of any suitable well-known construction. Different detector methods may be employed to determine the scattered and/or reflected power. To obtain a grating pitch, the photo detector or photo multiplier 1206 may be mounted on a rotation stage 1208 of any suitable well-known design. A microprocessor 1210, of any suitable well-known design, may be used to process detector readouts, including, but not limited to, intensity properties of the specularly reflected light, polarization properties of the specularly reflected light, and angular locations of different diffracted orders leading to diffraction grating pitch calculations. Thus, light reflected from the sample 1204 may be accurately measured.

Figure 13:
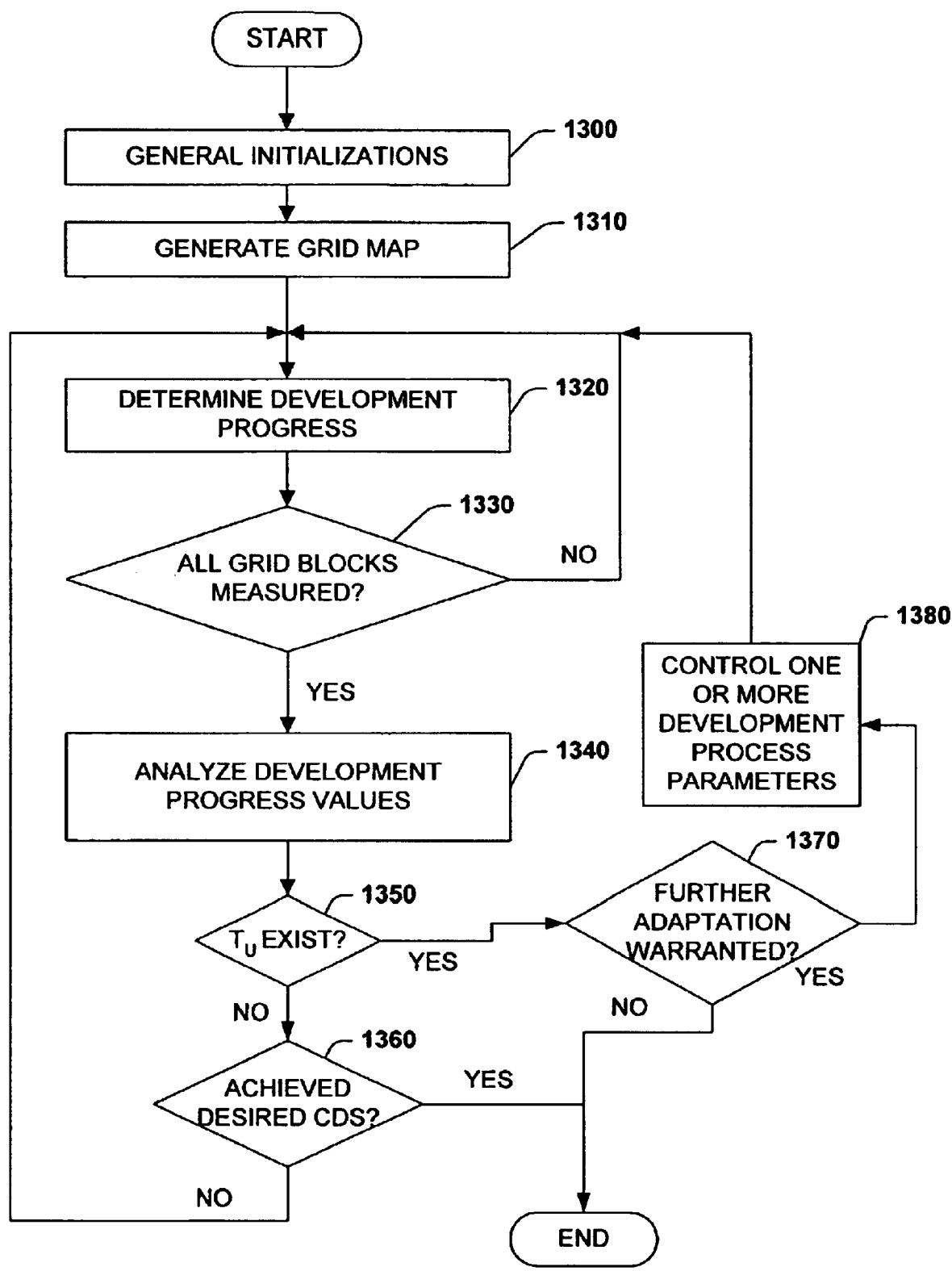
FIG. 13 is a flow diagram illustrating one specific methodology for carrying out the present invention.

In view of the exemplary systems shown and described above, methodologies that may be implemented in accordance with the present invention will be better appreciated with reference to the flow diagram of FIG. 13. While for purposes of simplicity of explanation, the methodology of FIG. 13 is shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

FIG. 13 is a flow diagram illustrating one particular methodology for carrying out the present invention. At 1300, general initializations are performed. Such initializations can include, but are not limited to, establishing pointers, allocating memory, setting variables and establishing communication channels. At 1310, a grid map of one or more grid blocks "XY" is created. At 1320, development determinations are made with respect to the various wafer portions mapped by the respective grid blocks XY. At 1330, a determination is made concerning whether all grid block measurements have been taken. If the determination at 1330 is NO, then processing returns to 1320. If the determination at 1330 is YES, then at 1340, determined dimension values are analyzed and compared against acceptable CDs for the respective portions of a wafer. In an alternative example of the present invention, the determination at 1330 may concern whether a sufficient number of grid blocks have been measured to facilitate valid CD analysis.

At 1350, a determination is made concerning whether development values are not acceptable. If development values are acceptable, then processing continues at 1360 where a determination is made concerning whether desired CDs have been achieved. If desired CDs have been achieved, then developer end point detection has been achieved and processing can conclude. Otherwise, processing continues at 1320. If unacceptable dimension values are found at 1350, processing proceeds to 1370 where a determination is made concerning whether further adaptation is warranted. By way of illustration, the unacceptable dimension values may indicate that portions of the wafer and/or the entire wafer being processed have been damaged to such an extent that further adaptations to the development process are unwarranted. Such a damaged portion and/or wafer may be marked for discard. By way of further illustration, analysis of the unacceptable dimensions may indicate that a simple adaptation is appropriate. The present iteration is then ended and the process returns to 1320 to perform another iteration.

Turning now to FIGS. 14–19, the concepts of scatterometry and reflectometry and how they are employed in the present invention are discussed. Scatterometry is a technique for extracting information about a surface upon which an incident light has been directed. Scatterometry is a metrology that relates the geometry of a sample to its scattering effects. Scatterometry is based on the reconstruction of the grating profile from its optical diffraction responses. Reflectometry is a metrology that relates the geometry of a sample to its reflecting effects. Reflectometry is based on reconstructing the grating profile based on variations between intensity and polarization of a reference beam and a reflected beam. Scatterometry and/or reflectometry can be employed together to acquire information concerning properties including, but not limited to, dishing, erosion, profile, thickness of thin films and critical dimensions of features present on a surface. The information can be extracted by comparing the phase, polarization and/or intensity of a reference light directed onto the surface with phase, polarization and/or intensity signals of a complex reflected and/or diffracted light resulting from the incident light reflecting from and/or diffracting through the surface upon which the incident light was directed. The intensity, polarization and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface. In the present invention, the phase, polarization and/or intensity of the reflected and/or diffracted light will be examined as it relates to critical dimensions desired on the wafer being developed to facilitate detecting a developer endpoint.

Different combinations of the above-mentioned properties will have different effects on the phase, polarization and/or intensity of the incident light resulting in substantially unique intensity/polarization/phase signatures in the complex reflected and/or diffracted light. Thus, by examining a signal (signature or stored value) library of intensity/polarization/phase signatures, a determination can be made concerning the properties of the surface. Such substantially unique intensity/polarization/phase signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk, \text{ where } j \text{ is an imaginary number.}$$

The signal (signature) library can be constructed from observed intensity/polarization/phase signatures and/or signatures generated by modeling and simulation. By way of illustration, when exposed to a first incident light of known intensity, wavelength and phase, a first grating on a wafer can generate a first intensity/polarizationphase signature. Similarly, when exposed to the first incident light of known intensity, wavelength and phase, a second grating on a wafer can all generate a second intensity/polarization/phase signature. For example, a line of a first width may generate a first signature while a line of a second width may generate a second signature. Observed signatures can be combined with simulated and modeled signatures to form the signal (signature) library. Simulation and modeling can be employed to produce signatures against which measured intensity/polarizationphase signatures can be matched. In one exemplary aspect of the present invention, simulation, modeling and observed signatures are stored in a signal (signature) library containing over three hundred thousand intensity/polarization/phase signatures. Thus, when the intensity/polarization/phase signals are received from scatterometry and/or reflectometry detecting components, the intensity/polarization/phase signals can be pattern matched, for example, to the library of signals to determine whether the signals correspond to a stored signature.

Figure 14:
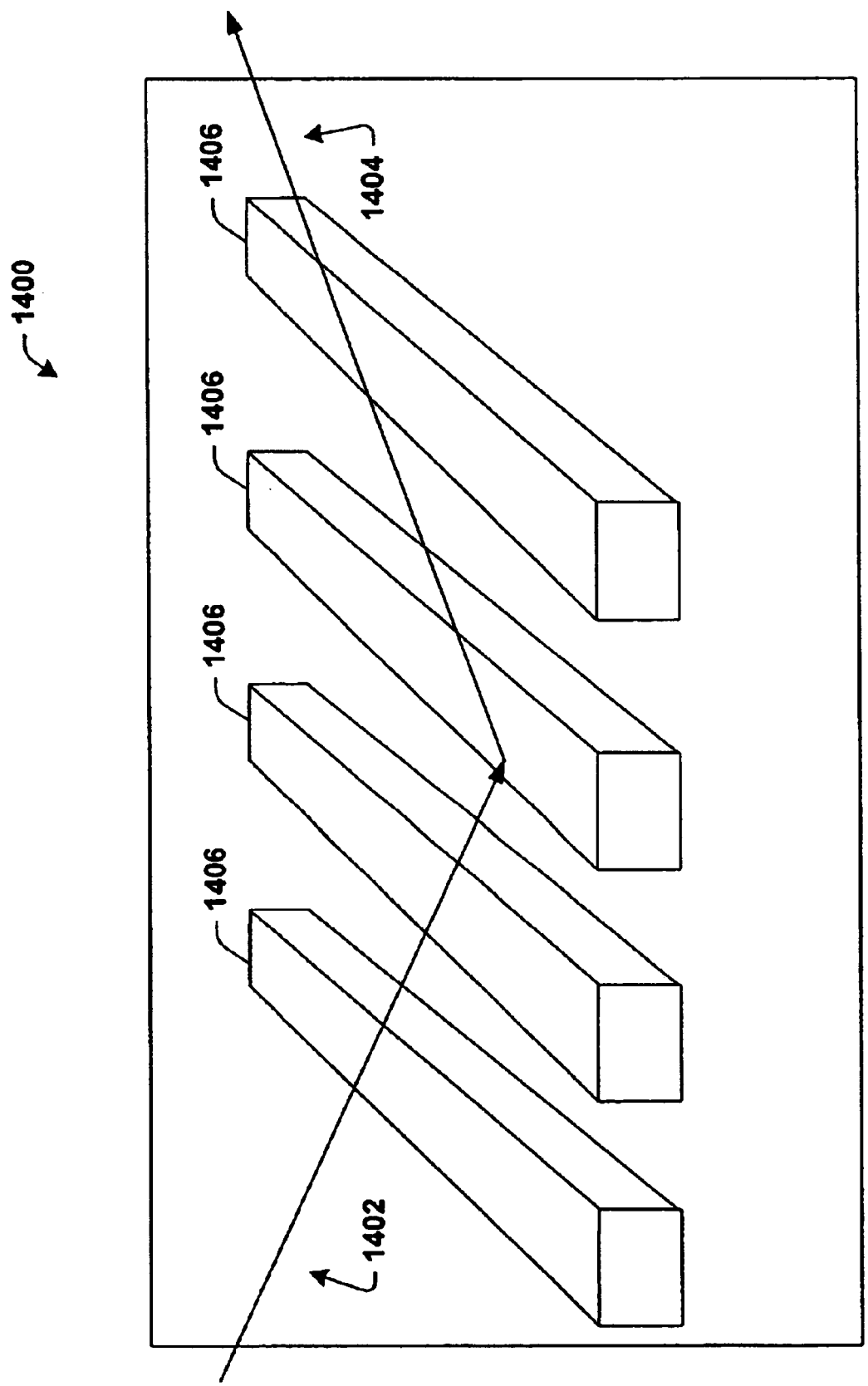
FIG. 14 is a simplified perspective view of an incident light reflecting off a surface, in accordance with an aspect of the present invention.

To illustrate the principles described above, reference is now made to FIGS. 14 through 19. Referring initially to FIG. 14, an incident light 1402 is directed at a surface 1400, upon which one or more features (e.g., gratings) 1406 may exist. The incident light 1402 is reflected as reflected light 1404. The properties of the surface 1400, including but not limited to, thickness, uniformity, planarity, chemical composition and the presence of features, can affect the reflected light 1404. The features 1406 are raised upon the surface 1400. The phase, polanzation and/or intensity of the reflected light 1404 can be measured and plotted, as partially shown, for example, in FIG. 19. Such plots can be employed to compare measured signals with signatures stored in a signature library using techniques like pattern matching, for example.

Figure 15:
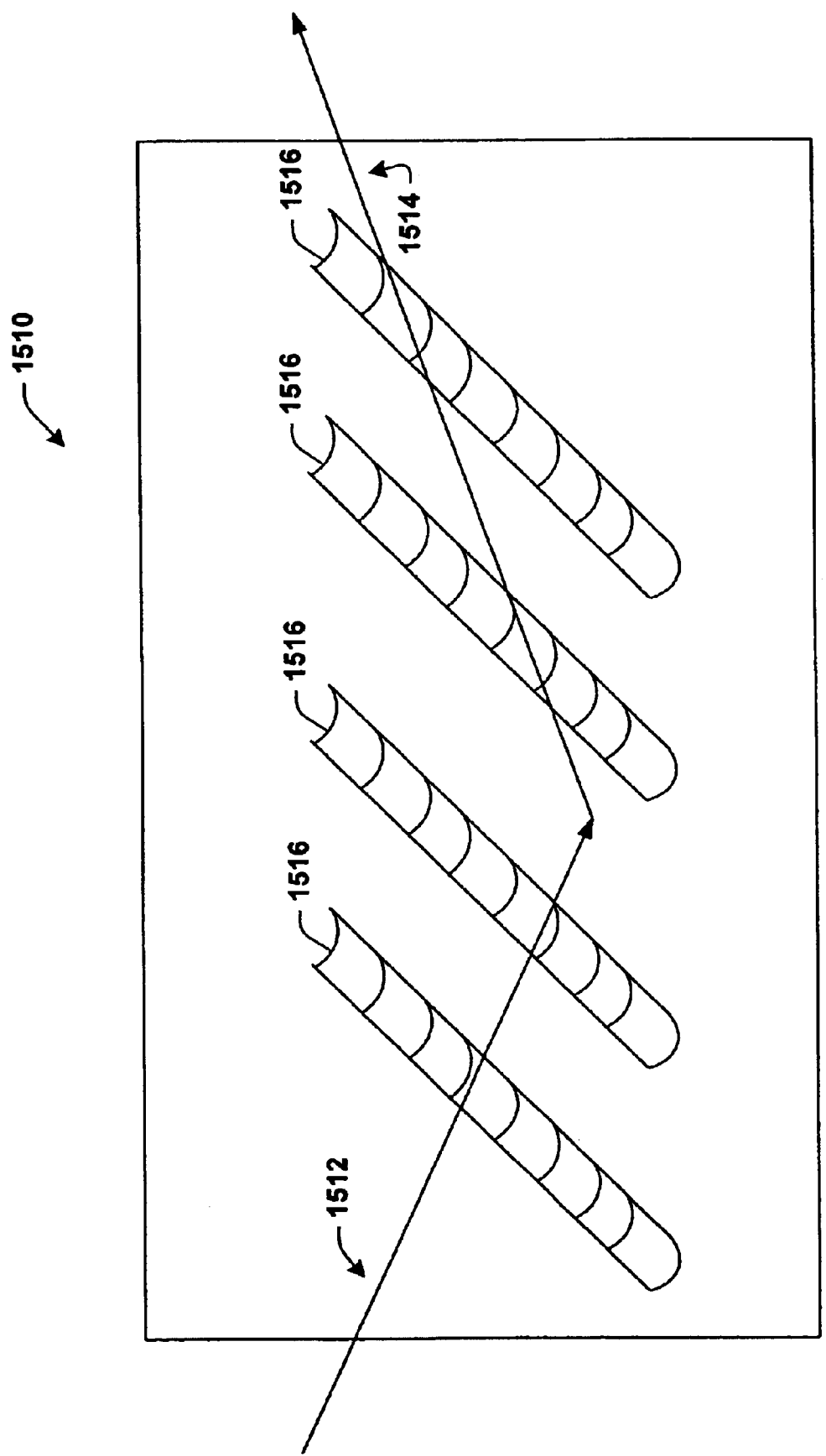
FIG. 15 is a simplified perspective view of an incident light reflecting off a surface, in accordance with an aspect of the present invention.

Referring now to FIG. 15, an incident light 1512 is directed onto a surface 1510 upon which one or more depressions 1516 appear. The incident light 1512 is reflected as reflected light 1514. Like the one or more features 1406 (FIG. 14) may affect an incident beam, so too may the one or more depressions 1516 affect an incident beam. Thus, it is to be appreciated that scatterometry and/or reflectometry can be employed to measure features appearing on a surface, features appearing in a surface, features emerging in a pattern, and properties of a surface itself, regardless of features.

Figure 16:
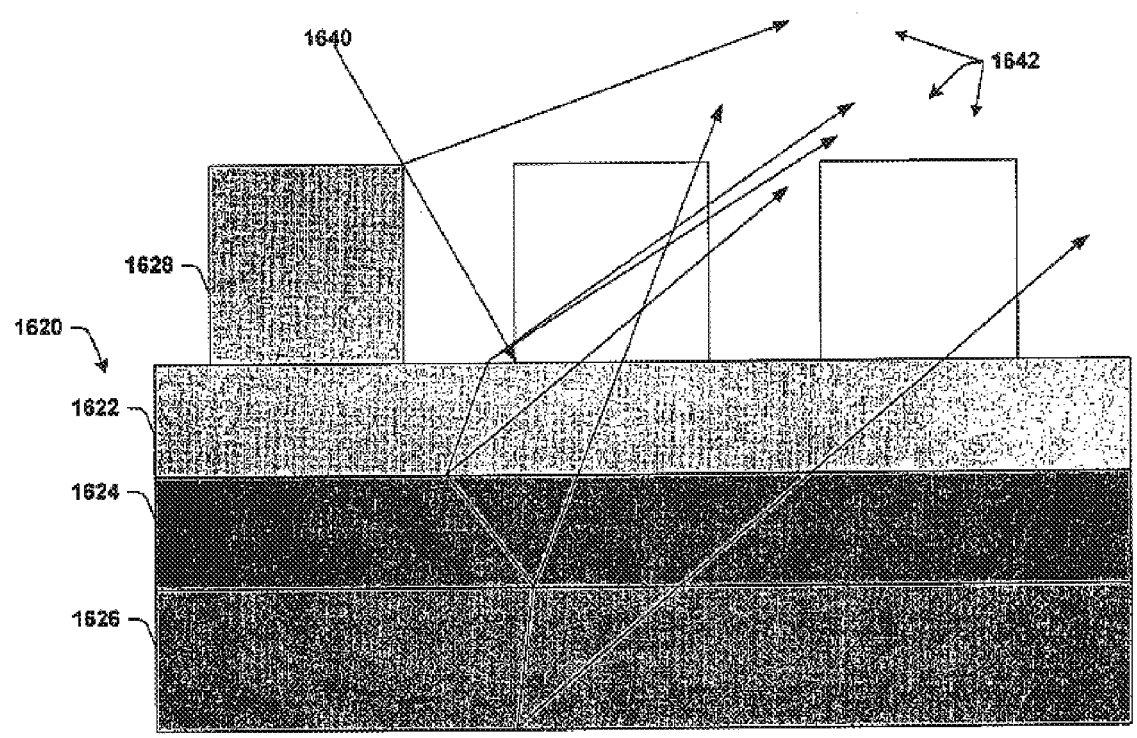
FIG. 16 illustrates a complex reflected and refracted light produced when an incident light is directed onto a surface, in accordance with an aspect of the present invention.

Turning now to FIG. 16, complex reflections and refractions of an incident light 1640 are illustrated. The reflection and refraction of the incident light 1640 can be affected by factors including, but not limited to, the presence of one or more features 1628, and the composition of the substrate 1620 upon which the features 1628 reside. For example, properties of the substrate 1620 including, but not limited to the thickness of a layer 1622, the chemical properties of the layer 1622, the opacity and/or reflectivity of the layer 1622, the thickness of a layer 1624, the chemical properties of the layer 1624, the opacity and/or reflectivity of the layer 1624, the thickness of a layer 1626, the chemical properties of the layer 1626, and the opacity and/or reflectivity of the layer 1626 can affect the reflection and/or refraction of the incident light 1640. Thus, a complex reflected and/or refracted light 1642 may result from the incident light 1640 interacting with the features 1628, and/or the layers 1622, 1624 and 1626. Although three layers 1622, 1624 and 1626 are illustrated in FIG. 16, it is to be appreciated that a substrate can be formed of a greater or lesser number of such layers.

Figure 17:
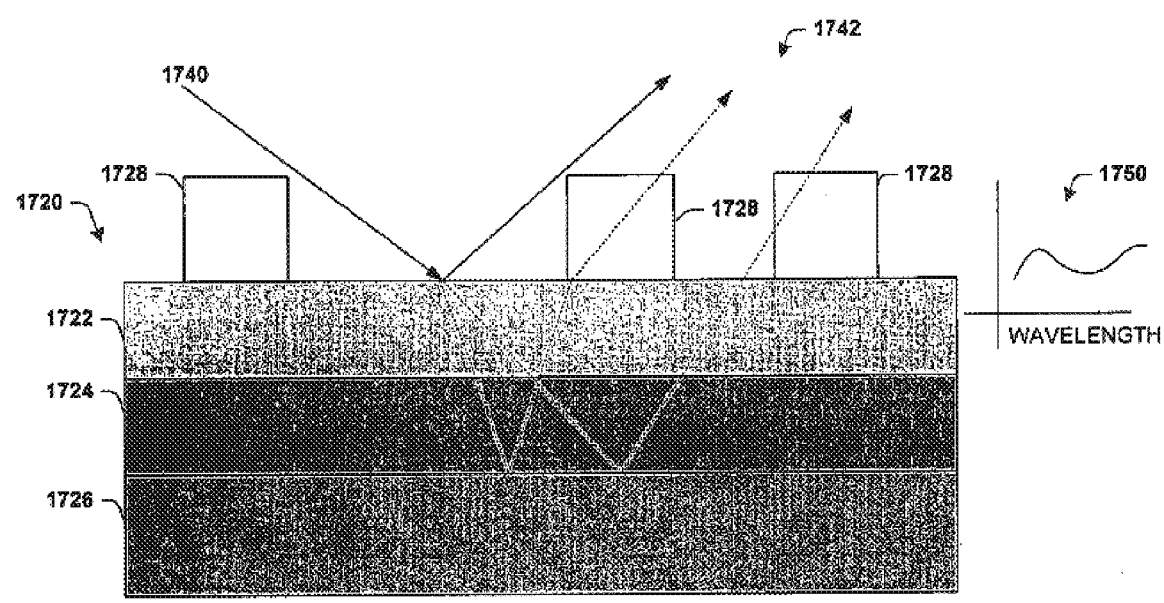
FIG. 17 illustrates a complex reflected and refracted light produced when an incident light is directed onto a surface, in accordance with an aspect of the present invention.
Figure 18:
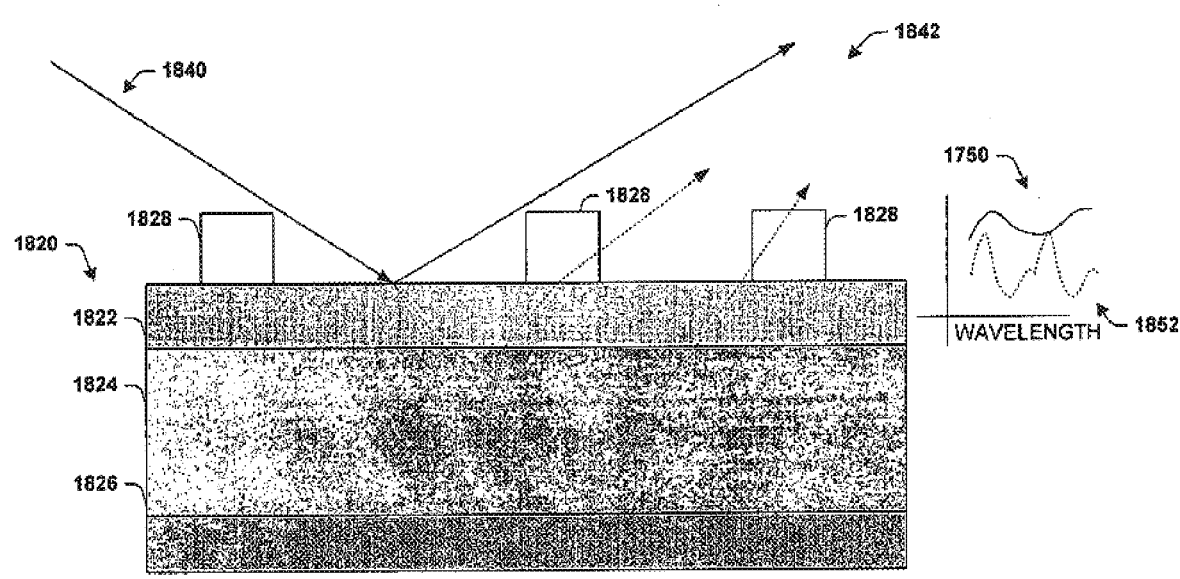
FIG. 18 illustrates a complex reflected and refracted light produced when an incident light is directed onto a surface, in accordance with an aspect of the present invention.
Figure 19:
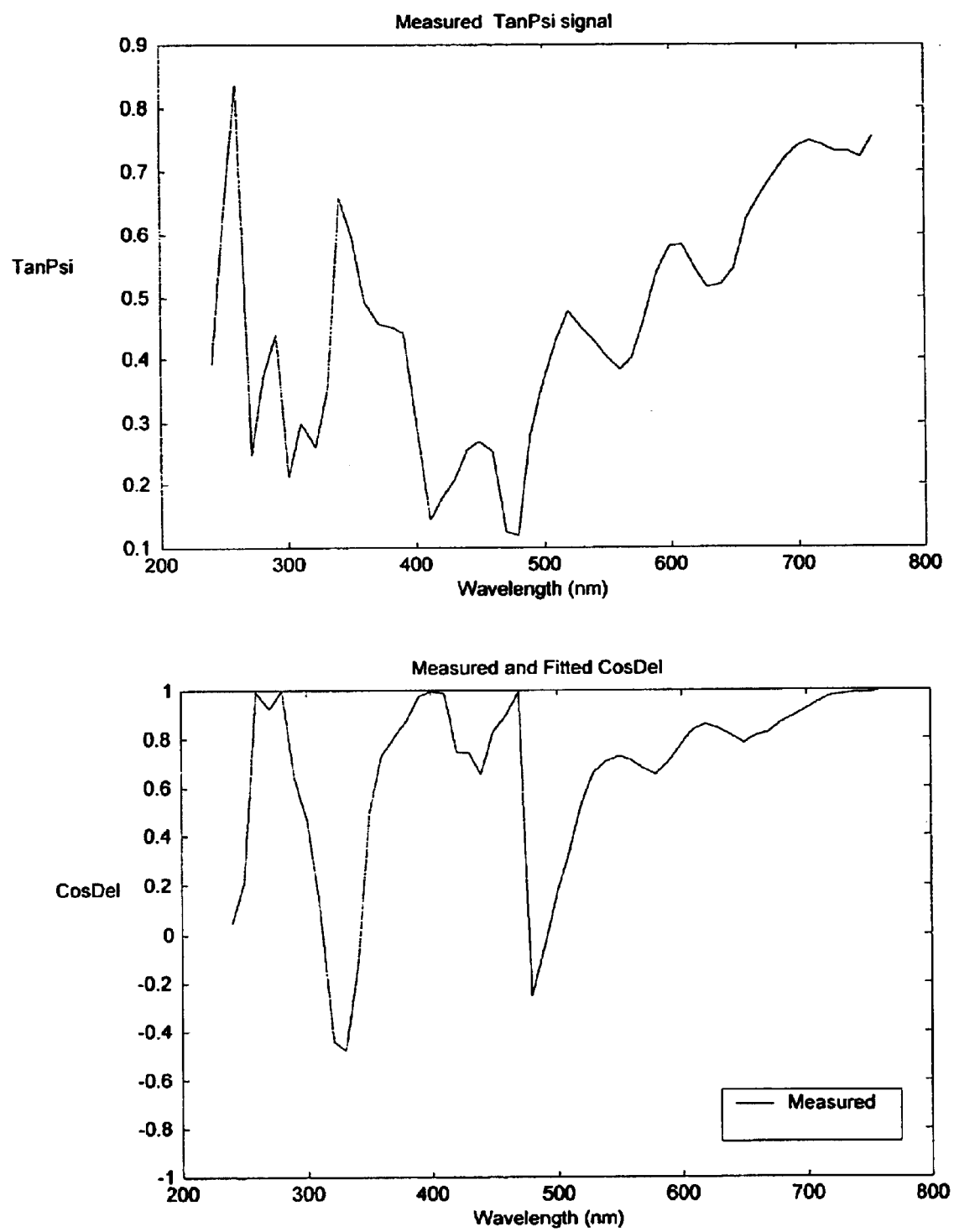
FIG. 19 illustrates phase, polarization and/or intensity signals recorded from a complex reflected and refracted light produced when an incident light is directed onto a surface, in accordance with an aspect of the present invention.

Turning now to FIG. 17, one of the properties from FIG. 16 is illustrated in greater detail. The substrate 1720 can be formed of one or more layers 1722, 1724 and 1726. The phase 1750 of the reflected and/or refracted light 1742 can depend, at least in part, on the thickness of a layer, for example, the layer 1724. Thus, in FIG. 18, the phase 1852 of the reflected light 1842 differs from the phase 1750 due, at least in part, to the different thickness of the layer 1824 in FIG. 18.

Thus, scatterometry and reflectometry are techniques that can be employed to extract information about a surface upon which an incident light has been directed. The information can be extracted by analyzing phase, polarization and/or intensity signals of a complex reflected and/or diffracted light. The intensity, polarization and/or the phase of the reflected and/or diffracted light will change based on properties of the surface upon which the light is directed, resulting in substantially unique signatures that can be analyzed to determine one or more properties of the surface upon which the incident light was directed.

Using scatterometry and/or reflectometry in the present invention facilitates a relatively non-invasive approach to detecting development end points and to reproducing successful development processes in subsequent development cycles.

Described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for monitoring and regulating a development process, comprising:

at least one development component operative to adapt one or more development parameters associated with developing a photoresist on at least one portion of a wafer;

a development component driving system for driving the at least one development component;

a system for directing light toward one or more gratings located on at least one portion of the wafer;

a development monitoring system operable to measure development progress from light reflected from the one or more gratings; and a processor operatively coupled to the development monitoring system and the development component driving system, wherein the processor receives a development progress data from the measuring system and analyzes the development progress data by comparing the development progress data to stored development data to generate a feed-forward control data operative to control the at least one development component.

2. The system of claim 1, the development monitoring system further comprising a scatterometry system for processing the light reflected from the one or more gratings.

3. The system of claim 2, the processor being operatively coupled to the scatterometry system, the processor analyzing data received from the scatterometry system and producing an analyzed data and the processor controlling, at least in part, the at least one development component via the development component driving system based, at least in part, on the analyzed data.

4. The system of claim 1, the development monitoring system further comprising a reflectometry system for processing the light reflected from the one or more gratings.

5. The system of claim 4, the processor being operatively coupled to the reflectometry system, the processor analyzing data received from the reflectometry system and producing an analyzed data and the processor controlling, at least in part, the at least one development component via the development component driving system based, at least in part, on the analyzed data.

6. The system of claim 3, the development monitoring system further comprising a reflectometry system for processing the light reflected from the one or more gratings.

7. The system of claim 6, the processor being operatively coupled to the reflectometry system, the processor analyzing data received from the reflectometry system and producing an analyzed data and the processor controlling, at least in part, the at least one development component via the development component driving system based, at least in part, on the analyzed data.

8. The system of claim 3, wherein the scatterometry system is operable to detect a development end point and where the feed-forward control data is employed to terminate development.

9. The system of claim 5, wherein the reflectometry system is operable to detect a development end point and where the feed-forward control data is employed to terminate development.

10. The system of claim 7, wherein the scatterometry system is operable to detect a development end point, where the reflectometry system is operable to detect a development end point and where the feed-forward control data is employed to terminate development.

11. The system of claim 8, the processor logically mapping the wafer into one or more grid blocks and making a determination of the acceptability of a development value in the one or more grid blocks.

12. The system of claim 11, wherein the processor determines the existence of an unacceptable development value for at least a portion of the wafer based on comparing one or more measured development values to one or more stored development values.

13. The system of claim 12, wherein the processor employs a non-linear training system in computing feed-forward control data operable to adjust the at least one development component.

14. The system of claim 9, the processor logically mapping the wafer into one or more grid blocks and making a determination of the acceptability of a development value in the one or more grid blocks.

15. The system of claim 14, wherein the processor determines the existence of an unacceptable development value for at least a portion of the wafer based on comparing one or more measured development values to one or more stored development values.

16. The system of claim 15, wherein the processor employs a non-linear training system in computing feed-forward control data operable to adjust the at least one development component.

17. The system of claim 10, the processor logically mapping the wafer into one or more grid blocks and making a determination of the acceptability of a development value in the one or more grid blocks.

18. The system of claim 17, wherein the processor determines the existence of an unacceptable development value for at least a portion of the wafer based on comparing one or more measured development values to one or more stored development values.

19. The system of claim 18, wherein the processor employs a non-linear training system in computing feed-forward control data operable to adjust the at least one development component.

20. A method for monitoring and regulating a development process comprising:

logically partitioning a wafer into one or more portions;

fabricating one or more gratings on the wafer;

directing an incident light onto at least one of the one or more gratings;

collecting a reflected light reflected from the at least one grating;

measuring the reflected light to determine one or more critical dimensions associated with the at least one grating;

computing one or more adjustments for one or more development components by comparing the one or more critical dimensions to scatterometry signatures associated with one or more stored critical dimensions; and adjusting the development process based, at least in part, on the one or more adjustments.

21. The method of claim 20, further comprising processing the reflected light in a scatterometry system.

22. The method of claim 21 wherein computing the one or more adjustments is based, at least in part, on data received from the scatterometry system.

23. A method for monitoring and regulating a development process comprising:

logically partitioning a wafer into one or more portions;

fabricating one or more gratings on the wafer;

directing an incident light onto at least one of the one or more gratings;

collecting a reflected light reflected from the at least one grating;

measuring the reflected light to determine one or more critical dimensions associated with the at least one grating;

computing one or more adjustments for one or more development components by comparing the one or more critical dimensions to reflectometry signatures associated with one or more stored critical dimensions; and adjusting the development process based, at least in part, on the one or more adjustments.

24. The method of claim 23, further comprising processing the reflected light in a reflectometry system.

25. The method of claim 24 wherein computing the one or more adjustments is based, at least in part, on data received from the reflectometry system.

26. A method for monitoring and regulating a development process comprising:

logically partitioning a wafer into one or more portions;

fabricating one or more gratings on the wafer;

directing an incident light onto at least one of the one or more gratings;

collecting a reflected light reflected from the at least one grating;

measuring the reflected light to determine one or more critical dimensions associated with the at least one grating;

computing one or more adjustments for one or more development components by comparing the one or more critical dimensions to at least one of scatterometry signatures and reflectometry signatures associated with one or more stored critical dimensions; and adjusting the development process based, at least in part, on the one or more adjustments.

27. The method of claim 26, further comprising processing the reflected light in at least one of a scatterometry system and a reflectometry system.

28. The method of claim 27 wherein computing the one or more adjustments is based, at least in part, on data received from at least one of the scatterometry system and the reflectometry system.

29. A system for monitoring and regulating a development process, comprising:

means for partitioning a wafer into one or more grid blocks;

means for sensing acceptability of development in at least one of the one or more grid blocks;

means for controlling the development of a wafer portion; and means for selectively controlling the means for development.

30. The system of claim 29 where the means for controlling the development of a wafer portion comprise means for terminating the development process.

* * * * *

UNITED STATES PATENT AND TRADEMARK OFFICE
CERTIFICATE OF CORRECTION

PATENT NO. : 6,758,612 B1
DATED : July 6, 2004
INVENTOR(S) : Cyrus E. Tabery et al.

It is certified that error appears in the above-identified patent and that said Letters Patent is hereby corrected as shown below:

Column 10,
Line 3, please change "lo" to -- to --.

Column 15,
Line 35, please change "polanzation" to -- polarization --.

Column 20,
Line 6, the following text should be added -- utilizing light reflected from one or more gratings";

Signed and Sealed this

Twenty-fourth Day of May, 2005

JON W. DUDAS
*Director of the United States Patent and Trademark Office*